(12) United States Patent
Kim

(10) Patent No.: US 6,737,308 B2
(45) Date of Patent: May 18, 2004

(54) SEMICONDUCTOR DEVICE HAVING LDD-TYPE SOURCE/DRAIN REGIONS AND FABRICATION METHOD THEREOF

(75) Inventor: Do-Hyung Kim, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/172,688

(22) Filed: Jun. 14, 2002

(65) Prior Publication Data

US 2002/0192868 A1 Dec. 19, 2002

(30) Foreign Application Priority Data

Jun. 14, 2001 (KR) ........................................ 2001-33550

(51) Int. Cl.[7] .......................................... H01L 21/8234
(52) U.S. Cl. ........................ 438/197; 438/299; 438/300; 438/301
(58) Field of Search ................................. 438/197, 299, 438/301, 300, 305, 306, 307, 303; 257/336

(56) References Cited

U.S. PATENT DOCUMENTS 6,180,472 B1 * 1/2001 Akamatsu et al. .......... 438/303
6,352,920 B1 * 3/2002 Shimomura ................ 438/637

FOREIGN PATENT DOCUMENTS

KR       2001-36179       5/2001

OTHER PUBLICATIONS

English language of Abstract for Korean Publication No. 2001–36179, published May 7, 2001.

* cited by examiner

Primary Examiner—Wael Fahmy
Assistant Examiner—Nathan W. Ha
(74) Attorney, Agent, or Firm—Marger Johnson & McCollom, P.C.

(57) ABSTRACT

A semiconductor device comprising LDD-type source/drain regions. A gate pattern is formed in insulated relationship over a substrate. Low-concentration implant regions may be formed in a surface layer of the substrate on both sides of the gate pattern. A second spacer layer may be formed conformal to a surface of the substrate and gate pattern. A first spacer may be formed on the second spacer layer and along the sidewalls of the gate pattern. A high-concentration implant may then be formed within the low-concentration source/drain regions using the gate pattern and the first spacer as ion-implantation masks. Thereafter, the first spacer is removed. Second spacers may then be formed from the second spacer layer and metal silicide patterned within exposed surface areas of the substrate as defined by the second spacers. An interlayer insulation layer may then be formed over the substrate and patterned to form contact holes to source/drain regions between the gate patterns.

6 Claims, 13 Drawing Sheets

SEMICONDUCTOR DEVICE HAVING LDD-TYPE SOURCE/DRAIN REGIONS AND FABRICATION METHOD THEREOF

RELATED APPLICATION

This application benefit and priority of Korean Patent Application No. 2001-33550, filed on Jun. 14, 2001, the contents of which are herein incorporated by reference in their entirety.

BACKGROUND OF THE INVENTION

This disclosure relates to a semiconductor device and a method of fabricating a semiconductor device. More particularly, the disclosure will describe a semiconductor device having LDD-type source/drain regions and will also describe a method of its fabrication.

As semiconductor devices become more highly integrated, MOS transistors may be formed with shallow source/drain junction regions. In order to increase a reliability of such MOS transistors, their methods of formation may provide for LDD-type source/drain regions. The formation of the LDD-type source/drain regions may use spacers along sidewalls of a gate electrode.

A method of forming self-aligned contacts for a highly integrated semiconductor device may use silicon nitride gate spacers of high etching selectivity with respect to a silicon oxide layer.

Referring to FIG. 1, a device isolation layer 2 may be formed in desired regions of semiconductor substrate 1 to define an active region. An insulation layer and a gate electrode layer 5 may be formed over the surface of the semiconductor substrate. A silicon nitride capping layer 7 may then be formed on the gate electrode layer. The capping layer and the gate electrode layer may be patterned as gate electrodes over desired regions of the gate insulation layer 3. At this time, exposed portions of the gate insulation layer 3 can be etched or may be removed by over-etching during patterning of the gate electrodes. Thus, the active regions of the substrate on both sides of the gate pattern 8 may be exposed.

Impurity ions may then be implanted into exposed regions of the active region with an implant dosage of $1 \times 10^{12}$ to $1 \times 10^{13}$ atoms/cm². Gate pattern 8 may serve as an ion-implantation mask during this implant. Thus, exposed portions of the active region on both sides of the gate pattern 8 receive this low-concentration implant to define lightly doped source/drain regions 9. Silicon nitride gate spacers 11 may then be formed against the sidewalls of gate patterns 8. Additional impurity ions may then be implanted, but with a higher dosage of $1 \times 10^{15}$ to $5 \times 10^{15}$ atoms/cm² into exposed regions of the previously defined low-concentration source/drain regions 9. The gate patterns 8 and associated gate spacers 11 may serve as ion-implantation masks during the higher dose implant, thereby forming high-concentration source/drain regions 13. These regions 13, accordingly, have higher impurity concentrations than that of the low-concentration source/drain regions 9. Such low-concentration source/drain regions 9 together with the high-concentration source/drain regions 13 may be referenced together as LDD-type source/drain regions 15.

Referring to FIG. 2, at the resultant surface where the LDD-type source/drain regions 15 are formed, an oxide layer may be etched to expose silicon at the surface of the substrate associated with source/drain regions. In order to decrease a resistance of an interface for a subsequent contact formation, a metal of titanium, tungsten or cobalt may be stacked over a surface of the substrate and thermally treated to form, e.g., a cobalt self aligned silicide (salicide) layer 16 in the surface layer of the substrate at locations within the source/drain regions. An etch stop layer 17 is then formed over the entire surface of the substrate including the gate. The etch stop layer 17 may comprise material having an etch selectivity with respect to (i.e., a different etch rate relative to) a silicon oxide layer.

As used herein, the terms wafer or substrate may be used to reference structures having an exposed surface for the formation of integrated circuits (IC). Substrate may include semiconductor wafers. Additionally, it may also be used to reference semiconductor structures that may be formed thereon during processing, and, thus, may include dielectric, conductive and semiconductor layers resulting from such processing. The substrate may include doped and undoped semiconductors or epitaxial semiconductor layers which may be supported by a base of semiconductor or insulator material, as well as other semiconductor structures known to one skilled in the art. Furthermore, the term conductor may include semiconductors, and the term insulator may be defined to include material less electrically conductive than the materials referred to as conductors.

Thus, width W1 between sidewalls of the etch stop layer 17 that may cover sidewalls of the gate patterns 8 is affected in part by spacers 11 and etch stop layer 17. Consequently, the etch stop layer 17 may be viewed as reducing the gap width W1 and increasing an aspect ratio of the space defined between the sidewalls of the etch stop layer along gate patterns 8. An interlayer insulation layer 19 is then formed over the entire surface of the semiconductor substrate, which now includes the etch stop layer 17. During the formation of the insulating layer 19, there may be a risk of a void 21 being formed within the interlayer insulation layer 19 at a region between gate patterns 8. This risk of void formation may become greater as the etch stop layer 17 thickness affects the aspect ratio resulting between gate patterns 8. In certain circumstances, void 21 may degrade the reliability of a semiconductor device.

Referring to FIG. 3, interlayer insulation layer 19 and etch stop layer 17 may be patterned to form a first contact hole 23a to expose a portion of metal salicide layer 16 of the LDD-type source/drain regions 15. Additionally, second contact hole 23b may be formed to expose a portion of metal salicide layer 16 of the LDD-type source/drain regions 15 neighboring the device isolation layer 2. The etch stop layer 17 may prevent recessing of the device isolation layer 2 during the formation of the contact openings. At this time, it may be difficult to expose a desired surface area of the LDD-type source/drain regions 15 (resulting from the first and second contact holes 23a and 23b as defined by the gate spacer 11) for the formation of contacts. Particularly, as illustrated in FIG. 3, if a mis-alignment should occur during photolithographic processing for the formation of the first and second contact holes 23a and 23b, the surface of the LDD-type source/drain regions 15 exposed by the first contact hole 23a may be further decreased. Such misalignment may be more burdensome to the peripheral part. For example, at the peripheral part, the surface exposed by contact opening 23b may be dramatically decreased by mis-alignment. When the contact surface is decreased the contact resistance increases. It may become difficult, therefor, to achieve effective operation for such a device, even though a metal salicide may be formed at the interface.

According to the conventional process as described above, it may be difficult to obtain sufficient surface contact area to the LDD-type source/drain regions as the level of circuit integrations increase. The contact holes to be defined by gate spacers, e.g. of silicon nitride layers, may not allow sufficient width for assuring low contact resistance. Thus, it may be difficult to decrease contact resistance of semiconductor devices, especially as their level of integrations increase. Further, since the gate spacers reduce the width of the contact openings between gates, the risk of void formation may increase due to the difficulty in filling narrowed gaps with interlayer insulation material. Thus, the reliability of a semiconductor device may be compromised.

SUMMARY OF THE INVENTION

Thus, it is an object of the present invention to provide a semiconductor device which can minimize a contact resistance and also improve device reliability and to provide for methods of fabricating the same.

In one embodiment, a semiconductor device may have contact areas to source/drain regions to enable interlayer insulation layer formation without voids.

In another embodiment, a method of forming a semiconductor device forms a salicide layer at source/drain regions for decreasing a contact resistance without inducing problems into shallow junction region.

In one embodiment, at least one gate pattern is formed in insulated relationship over a semiconductor substrate. A low-concentration source/drain region is formed in a layer of the substrate at regions located on both sides of the gate pattern. A second spacer layer may then be formed conformally across an entire surface of the semiconductor substrate including the regions of low-concentration. A first spacer may then be formed over the second spacer layer and beside sidewalls of the gate pattern. The first spacer may be formed of an insulation material having an etch selectivity with respect to the second spacer layer. Impurity ions may be implanted to define high-concentration source/drain regions of the substrate while using the gate pattern and the first spacer as ion-implantation masks. High-concentration source/drain regions may be formed with higher impurity-concentration than that of the low-concentration source/drain region.

Consequently, LDD-type source/drain regions composed of the low-concentration source/drain region and high-concentration source/drain region may be formed at both sides of the gate pattern. The first spacers may be removed to widen a gap between walls of the second spacer layer against sidewalls of the gate patterns. After removing the first spacers, the second spacer layers may be anisotropically etched to form second spacers at both sidewalls of the gate pattern. A metal silicide may then be formed in the silicon layer for exposed regions of the substrate. Then, an interlayer insulation layer may be formed over the resultant structure. Removing the first spacer and leaving only the second spacer may help reduce the risk of void formation during the formation of the interlayer insulation.

In a further embodiment, an etch stop layer is formed over the entire surface of the substrate as it would appear with the first spacer removed. The etch stop layer may be formed as a thin layer so as to leave a sufficient gap between gate patterns, which may be filled with interlayer insulation.

The interlayer insulation layer and second spacer layer may be sequentially patterned to form a contact hole to expose portions of the LDD-type source/drain regions. Removing the first spacers may permit a larger area of the LDD-type source/drain regions to be exposed by the contact hole.

In a further embodiment, a medium-concentration ion implantation may be provided before the formation of the salicide layer. The medium-concentration ion implantation may comprise supplying energy and impurity ion dose amounts between those of the low and high concentrations. The process of the medium-concentration ion implantation may be used to avoid electrical shorting between a contact and a substrate which may result from transformation of a lightly doped region into metal silicide. Such transformation may be likely for embodiments having metal salicide deeply formed within the substrate.

In another embodiment, the second spacer layer and the etch stop layer are formed of a material having an etch selectivity with respect to the interlayer insulation layer and also with respect to the first spacer. For a particular embodiment, the second spacer layer and the etch stop layer can be formed of silicon nitride or a silicon oxynitride. But when the etch stop layer is thermally treated, stresses may occur between the metal suicide and the etch stop layer. By forming the etch stop layer with silicon oxynitride, such stresses may be reduced. The first spacer may be formed of silicon oxide. Also, the interlayer insulation layer may be formed of a silicon oxide, e.g., such as an undoped silicate glass (USG) that contains no impurities.

In other embodiments, a capping layer may be formed on top of the gate pattern when the gate comprises a conductive layer. In further embodiments, the gate pattern may comprise polysilicon, which may be treated with a metal to form a metal salicide at the top of the gate pattern. This structure with the metal salicide on the polysilicon may assist contact formation over the gate pattern and within core regions of an integrated circuit.

In another embodiment, a semiconductor device comprises at least one MOS transistor having LDD-type source/drain regions. During formation of the MOS transistor, LDD-type source/drain regions may be formed in a surface region of the substrate on both sides of the gate pattern. A metal silicide may be formed at a surface layer of the LDD-type source/drain regions. Spacers may be formed along sidewalls of the gate pattern. An interlayer insulation may be formed over the substrate and the gate pattern with spacers. At least one contact plug may be formed to pierce the interlayer insulation layer and to contact a source/drain region. An etch stop layer may be formed over the entire surface of the substrate between the gate pattern having spacers and the interlayer insulation layer, and the contact plug may be formed to pierce the interlayer insulation layer and the etch stop layer.

The LDD-type source/drain regions may include a portion of low-concentration and a portion of high-concentration. The high-concentration portions of the LDD-type source/drain regions are spaced laterally from the spacers that may be formed at the sidewalls of the gate pattern. Alternatively, the low-concentration portions of the LDD-type source/drain regions may be formed in the substrate with horizontal widths wider than a thickness of the spacers. The low-concentration portion of the LDD-type source/drain regions may be extended literally from the high-concentration source/drain regions to beneath the edge of the gate pattern.

BRIEF DESCRIPTION OF THE DRAWINGS

Embodiments will now be described more fully hereinafter with reference to the accompanying drawings, in which.

DETAILED DESCRIPTION

This invention may be embodied in different forms and should not be construed as limited to the specific embodiments set forth herein. Rather, these exemplary embodiments are provided so that this disclosure will be thorough and complete, and will fully convey the invention to those skilled in the art. Also, when it is mentioned that a layer is on another layer or on a substrate, the layer may be directly formed on another layer or on a substrate, or a third layer can be interposed therebetween.

Additionally, as used herein, "etch stop layer" may refer a material that will have an etch selectivity with respect to material that may be etched above the etch stop layer. For example, nitride may be layered over a substrate to prevent etching of the substrate while etching material (e.g., silicon oxide) above the nitride.

Figure 1:
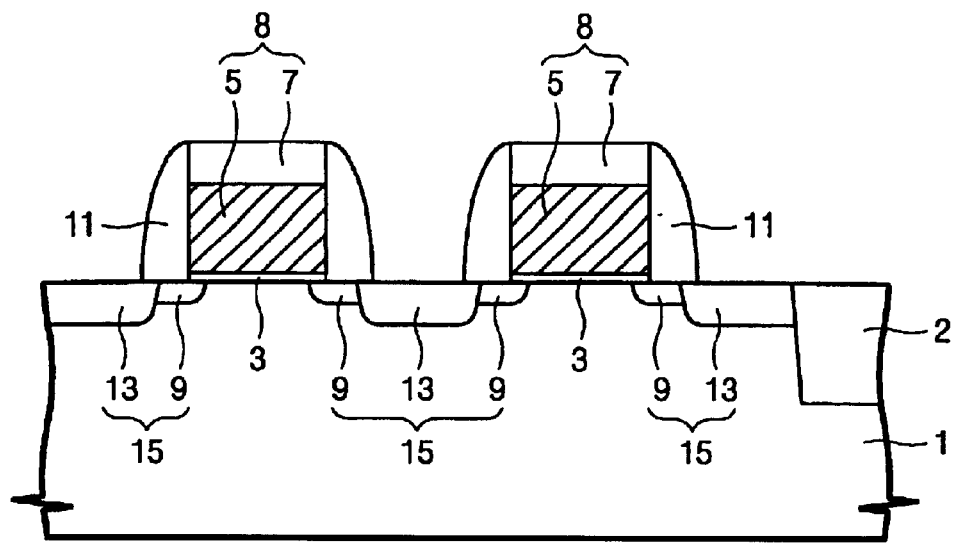
FIGS. 1 through 3 are cross-sectional views of a substrate for illustrating a conventional method of fabricating a semiconductor device.
Figure 2:
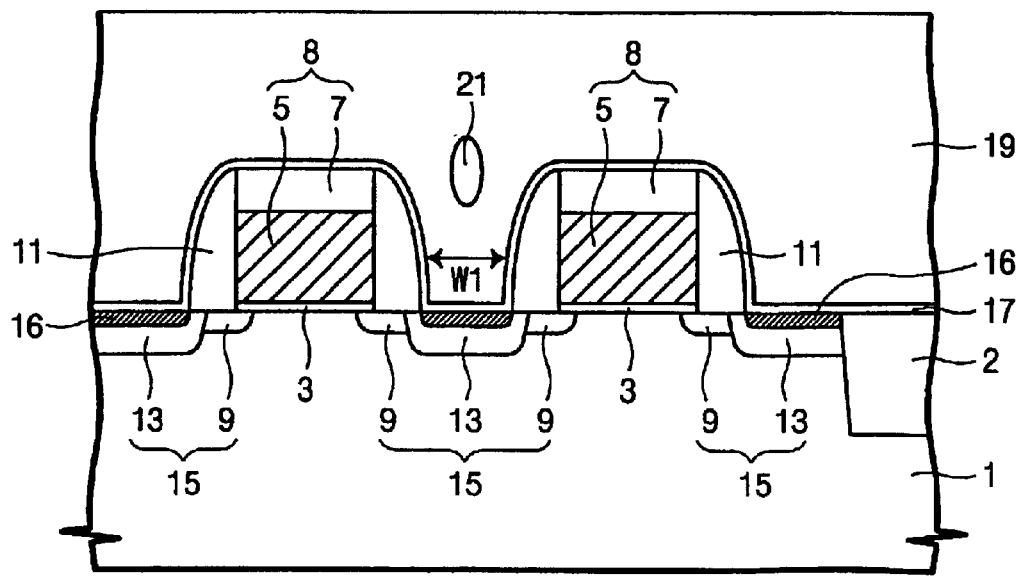
Figure 3:
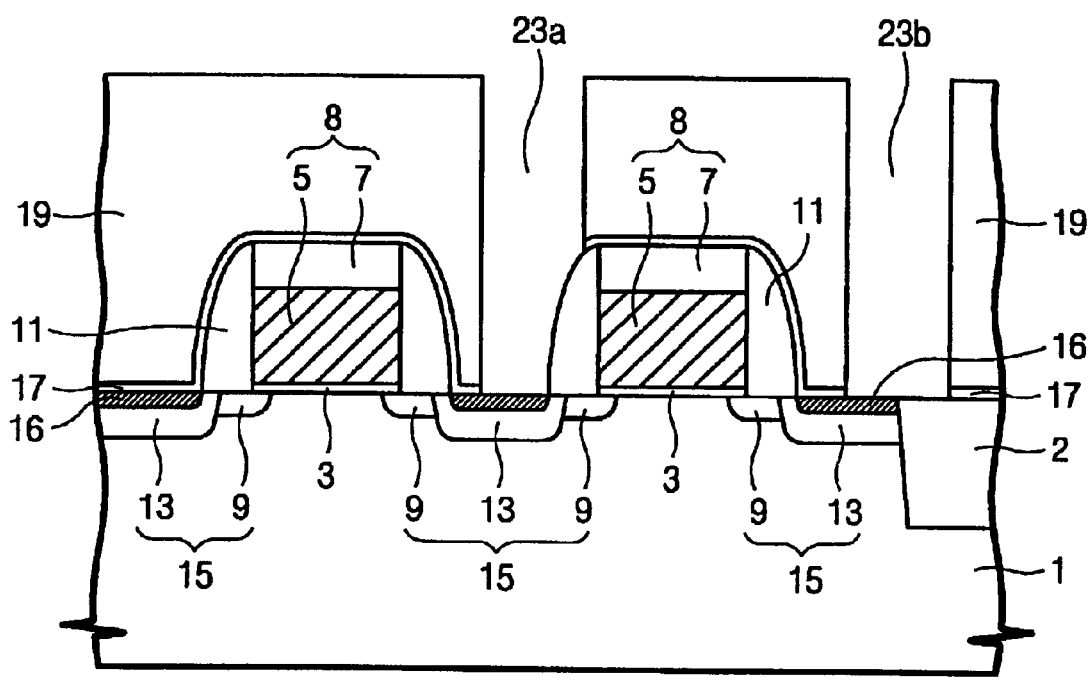
Figure 4:
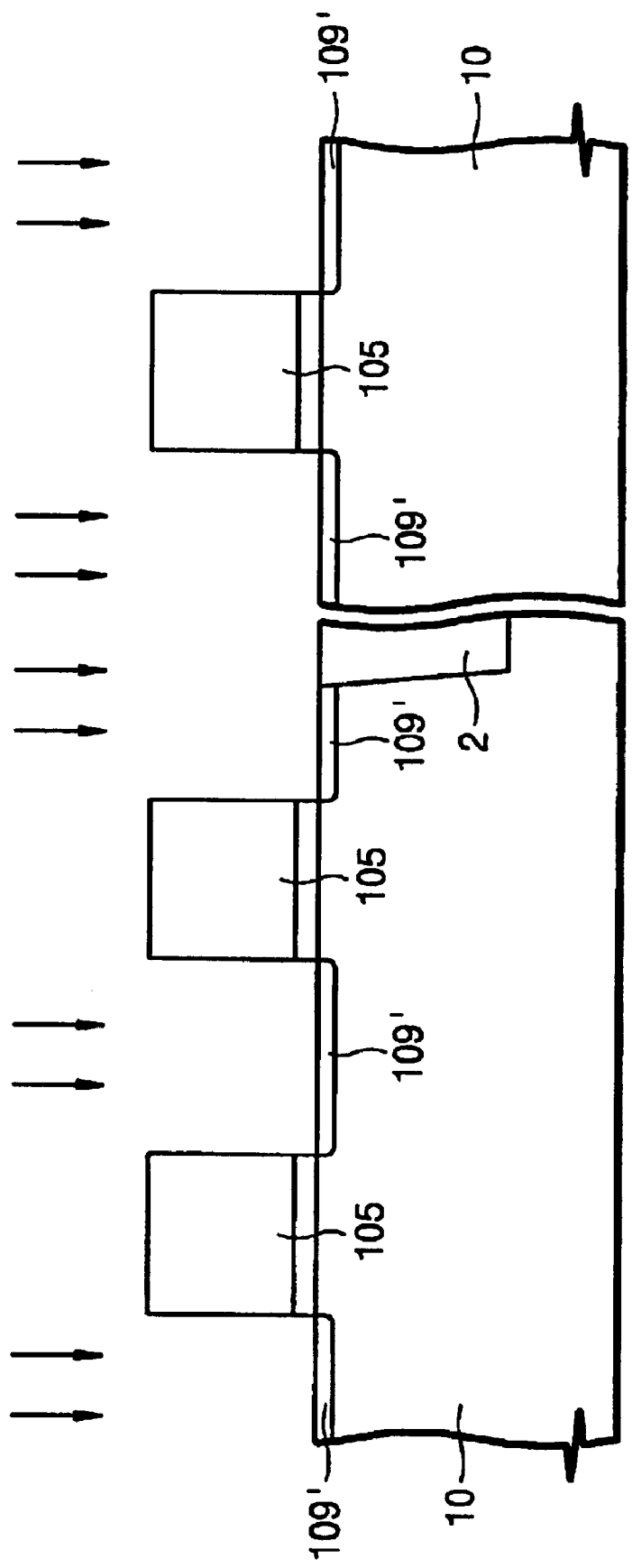
FIGS. 4 through 10 are cross-sectional views of a substrate for exemplary embodiments of the present invention associated with the formation of a semiconductor device.

Referring to FIG. 4, a gate pattern 105 may be formed in insulated relationship over substrate 10. A gate insulation layer may insulate gates 105 from body regions of the substrate 10. After forming the gate pattern 105, exposed portions of the gate insulation layer beyond the sidewalls of gate pattern 105 can be etched and removed. The gate pattern 105 may comprise polysilicon. After etch patterning to define gate patterns 105, an anneal may be used to recover the etch-damage. During the anneal, a thin oxide layer may be formed over the surface of the gate pattern and substrate. Impurity ions may be implanted using gate pattern 105 as an etch mask. For example, the impurity ions may be implanted using a low dose of $1\times10^{12}$ to $1\times10^{14}$ atoms/cm$^2$ and using a low energy level of 10 KeV for the implant. A low-concentration source/drain region 109' may be formed with a shallow depth with the low-concentration impurity-ion implant.

Figure 5:
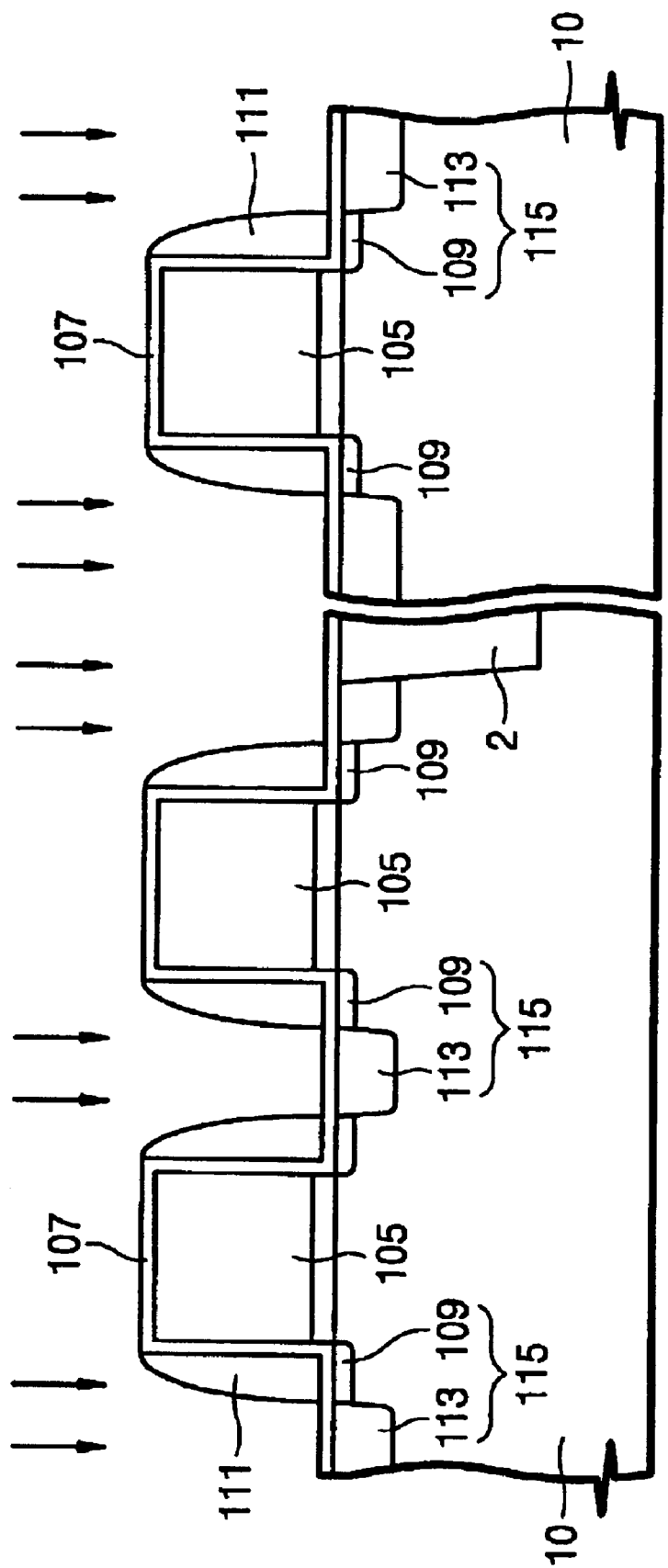

Referring to FIGS. 4 and 5, a second spacer layer 107 may be formed of a silicon nitride layer over the substrate 10 and over gate pattern 105. Then, a spacer layer of silicon oxide may be formed and then anisotropically etched (selectively with respect to nitride) to form first spacers 111 along sidewalls of the gate pattern 105 and over and against the second spacer layer 107.

Impurity ions may then be implanted using the first spacer 111 and gate pattern 105 as ion-implantation masks for defining high implantation regions. For example, in this embodiment, a high dose of $1\times10^{15}$ to $5\times10^{15}$ atoms/cm$^2$ of impurity ions may be implanted using implant energy of 40 KeV. Thus, high-concentration portion of the source/drain regions 113 may be formed for the LDD-type source/drain regions 115 on both sides of the gate pattern 107.

Figure 6:
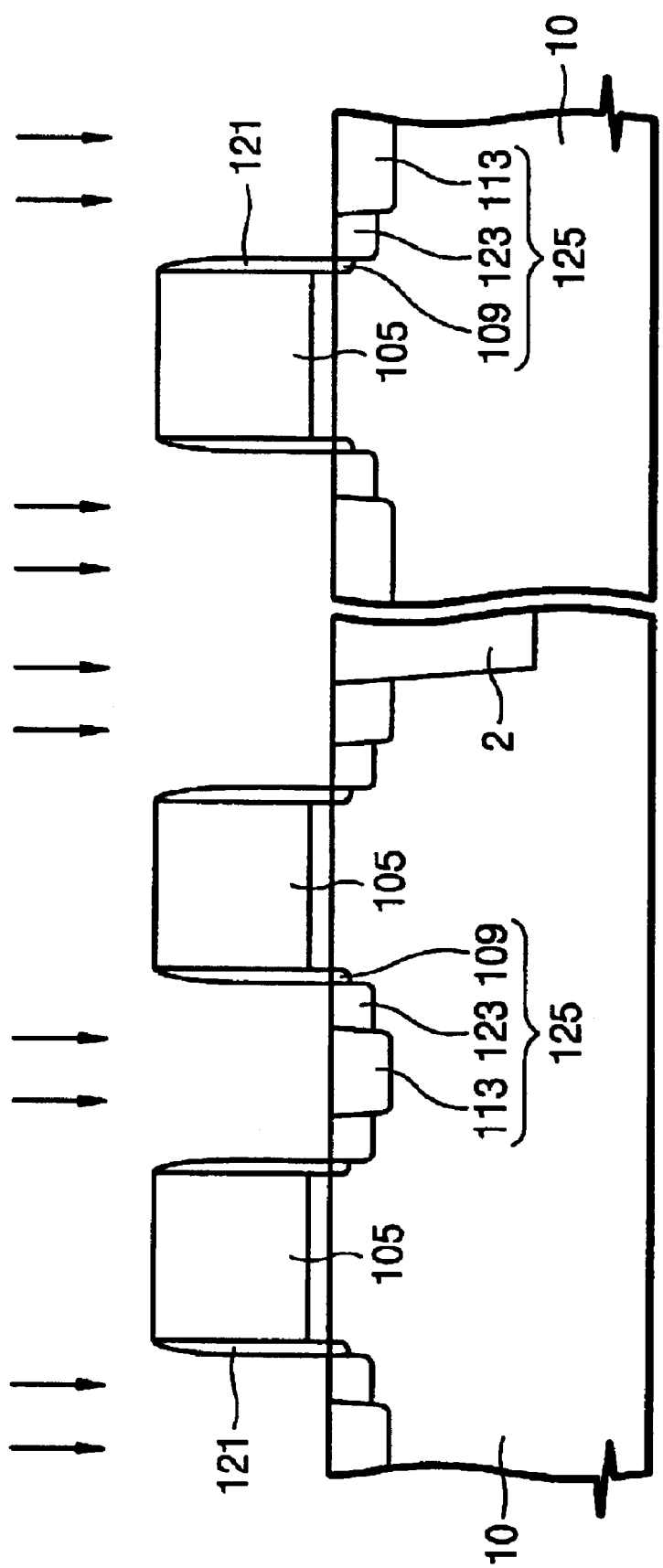

Referencing FIGS. 5 and 6, first spacer 111 may be etched and removed after formation of the high-concentration source/drain regions 113. Isotropic etching may be used to remove the oxide spacers 111. Next, anisotropic etching of the second spacer layer 107 may form second spacers 121 against sidewalls of the gate pattern 105. If a thin silicon oxide layer exists over the surface of the gate pattern and over the surface of the LDD-type source/drain regions 115, the silicon oxide layer may be removed during etching of the second spacer layer 107. Impurity ions may be implanted in regions of the substrate defined by gate 105 and second spacer 121. For example, a medium dosage implant of $1\times10^{14}$ to $1\times10^{15}$ atoms/cm$^2$ of impurity ions may be implanted with an implant energy of 25 KeV. Thus, it is possible to form LDD-type source/drain regions 125 with a three-step impurity-ion implant structure which may include a middle-concentration region 123.

Figure 7:
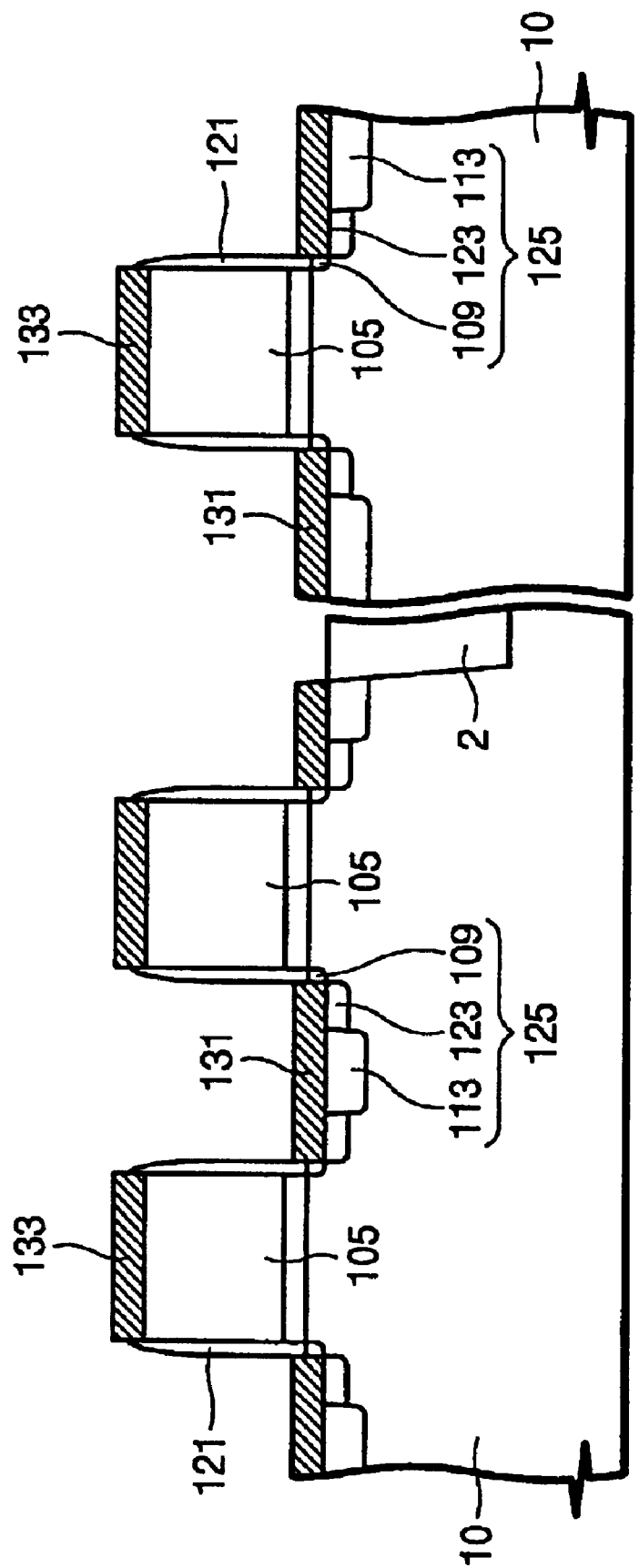

Referring to FIGS. 6 and 7, a metal such as tungsten or titanium may be stacked over the entire surface of substrate 10 and the resultant structure may be thermally treated to allow formation of metal silicide 131 and 133 on the surface of the gate pattern 105 and exposed source/drain regions 123 and 113. The metal layer over the isolation layer 2 and second spacers 121 will not transition into metal silicide. Thus, this metal that does not transition may be selectively removed during a subsequent metal etching process.

Further referencing FIG. 7, the second spacers 121 that are positioned against the sidewalls of gate patterns 105 may prevent metal and suicide formations above regions of the low-concentration portions 109 of the LDD-type source/drain regions 125, which may comprise a shallow implant depth. Thus, metal may be deposited and metal silicide 131 formed while the second spacers 121 guard against silicide consumption of the shallow, low-concentration portions 109 of LDD-source/drain regions 125.

Figure 8:
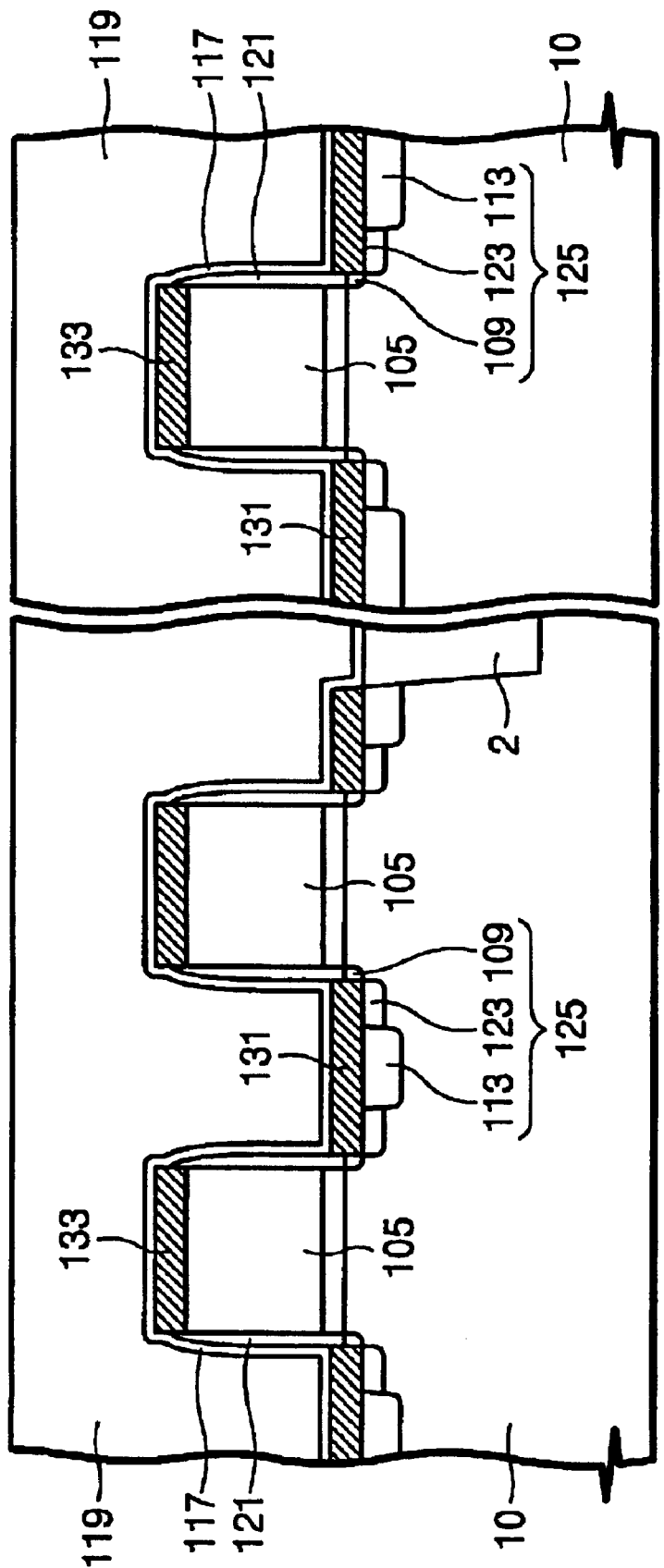

Referring to FIGS. 7 and 8, an etch stop layer 117, such as silicon oxynitride, may be formed as a coating over surfaces of the substrate and including metal silicide layers 131 and 133. Next, a silicon oxide may be formed over the substrate to provide interlayer insulation layer 119. With the first spacer having already been removed, the space between the gate patterns 105 may be greater than that which might otherwise be present, and the aspect ratio may be kept reasonable enough to allow for stacking of interlayer insulation material 119 with reduced risk of void formation.

Figure 9:
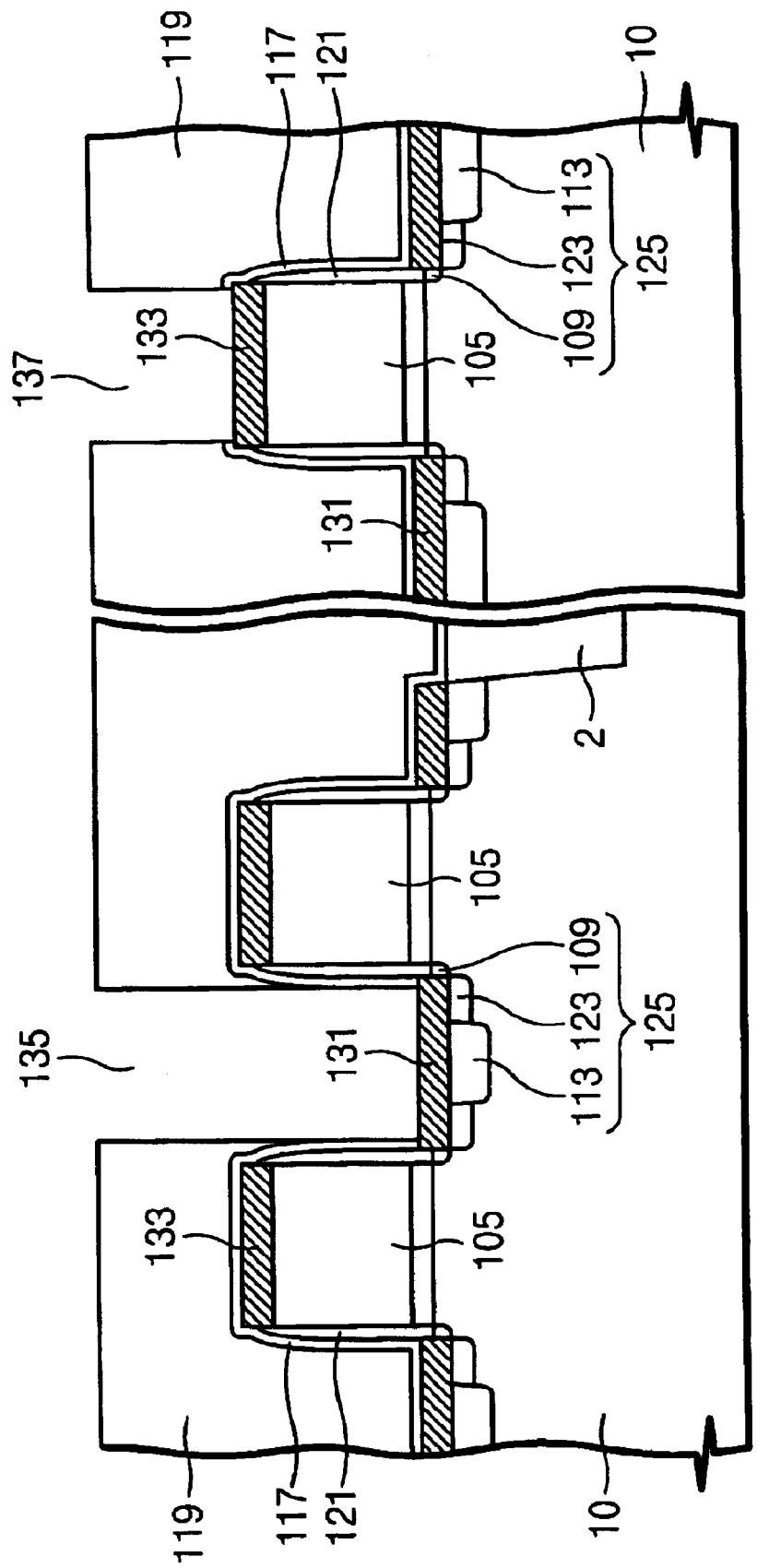

Referencing FIG. 9, interlayer insulation layer 119 may be patterned to form contact holes 135 to expose a part of the LDD-type source/drain regions 125 and to form contact holes 137 to expose a part of the top of the gate pattern 105. During etching of the interlayer insulation layer 119, the etch stop layer 117 may be used to prevent removal (or over etching into) metal silicide 131 of the source/drain regions 123 and 113. Additionally, the etch stop layer 117 may protect the device isolation layer 2 and the metal silicide layer 133 on the gate pattern 105 from being over etched during the patterning of the interlayer insulation layer 119. Continuing further, portions of etch stop layer 117 that are exposed may then be removed through holes 135 and 137. For embodiments that may include the formation of interconnections by a damascene process, grooves for such interconnections might be formed in the top of the interlayer insulation layer together with the formation of the contact holes.

It may be noted that by removing the first spacer, contact holes may be formed with widths sufficient to receive interlayer insulation therein. Also, such aperture contact holes may permit formation of contacts to areas of the drain/source regions regardless of small misalignments that may result during patterning of the contact holes.

Figure 10:
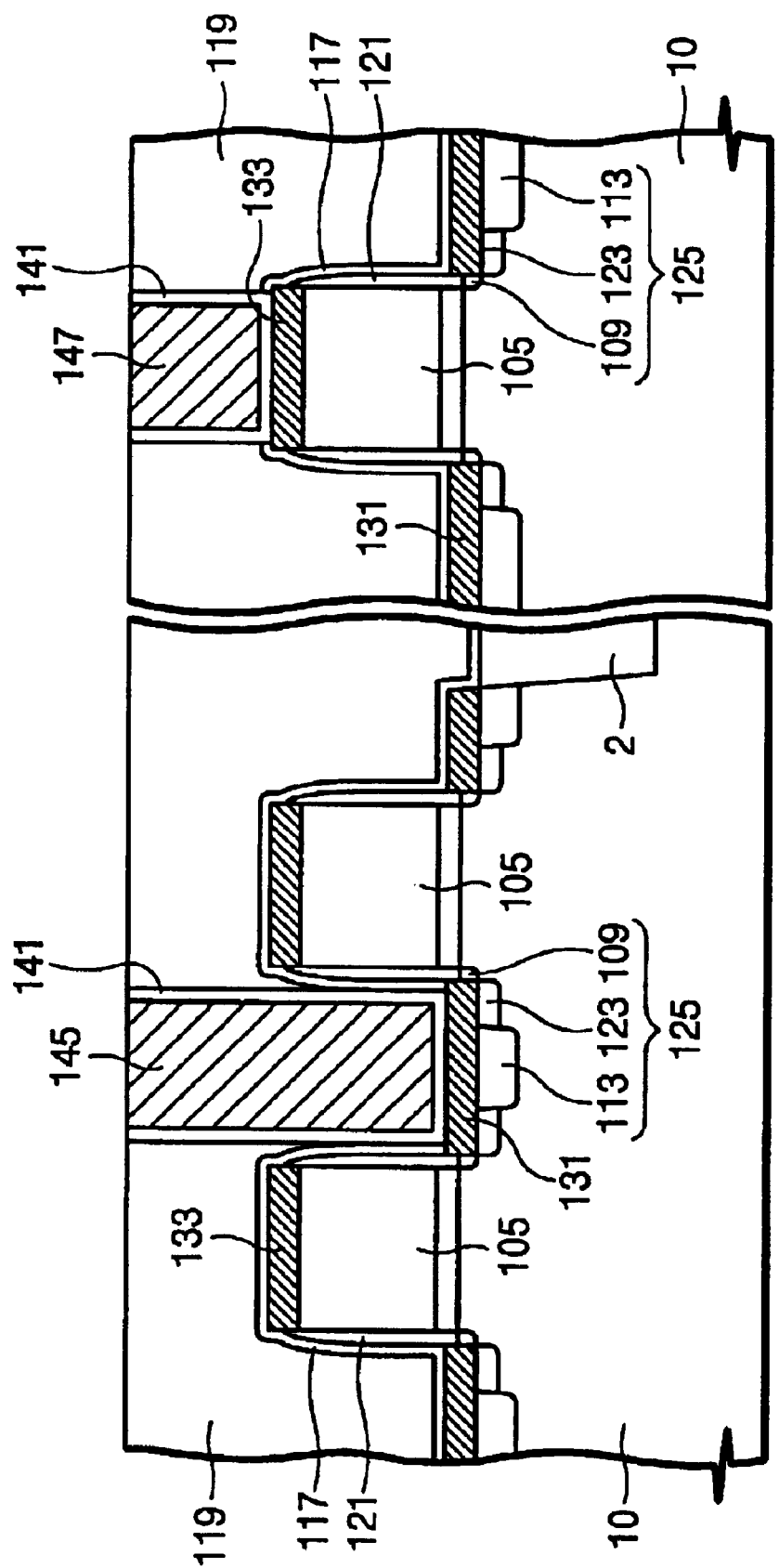

Referring to FIGS. 9 and 10, a contact barrier layer 141 may be formed (e.g., as a lining within) contact holes 135 and 137. This barrier layer 141, in this embodiment, may be formed by CVD. The contact holes may then be filled with metal, e.g., such as tungsten. A planarization, e.g., a CMP process, may then be performed to form contact plugs 145 and 147. For embodiments using a damascene process, the barrier layer and metal may be stacked in the interconnection grooves and CMP planarized the same as the stacking and planarization for the plug formations.

Figure 11:
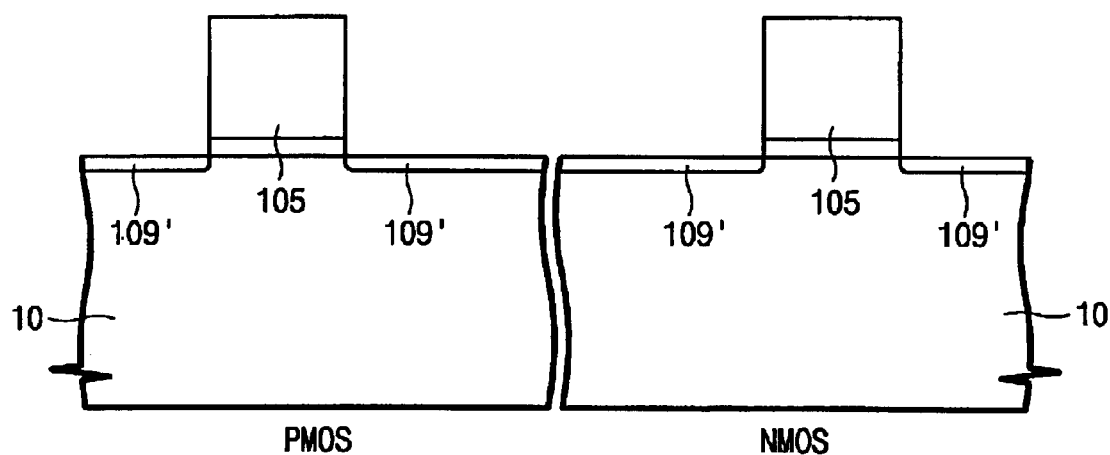
FIGS. 11 through 17 are cross-sectional views of a substrate for illustrating further exemplary embodiments associated with methods of forming a CMOS-type semiconductor device.

In another embodiment, referencing FIG. 11, a PMOS transistor region and an NMOS transistor region may both be formed for a semiconductor device. First, gate patterns 105 may be formed in insulated relationship over a surface of substrate 10. A gate insulation layer (e.g., gate oxide) may insulate gates 105 of both transistor regions. The gates may comprise polysilicon.

Two different photolithographic processes may be used for definition of the two different transistors regions. For example, an initial P-type impurity implant may be provided for the low-concentration source/drain regions 109' of the PMOS transistor, and a different N-type impurity implant may be provided for the low-concentration source/drain regions 109' of the NMOS transistor.

Figure 12:
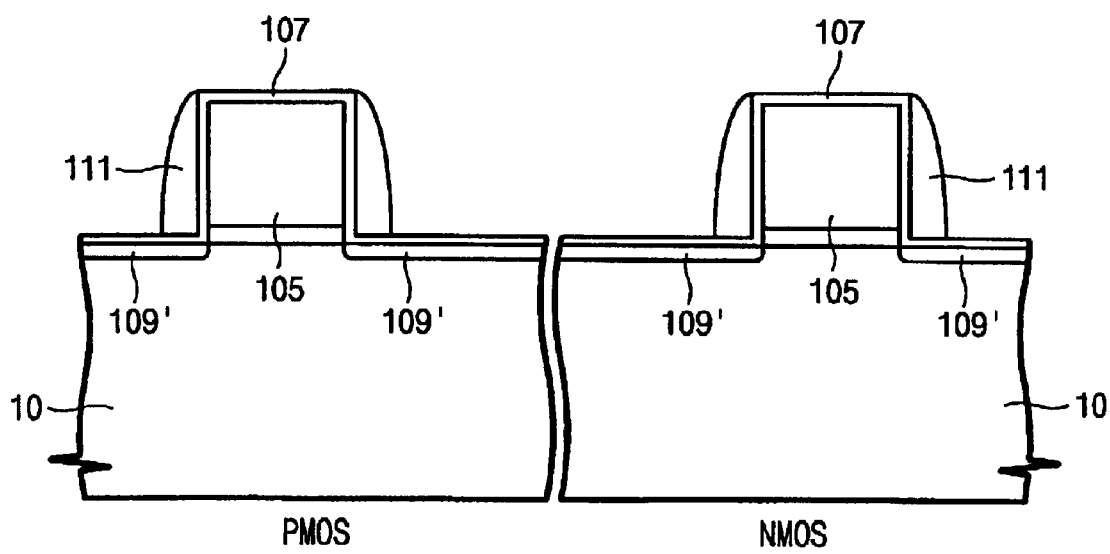

Referring to FIGS. 11 and 12, a second spacer layer 107 (e.g., of several hundreds of angstroms) and a first spacer layer may be sequentially stacked by CVD over the surface of substrate 10, i.e. including the low-concentration source/drain region 109' and over the gate patterns 104 of both transistor regions. The second spacer layer 107 may comprise silicon nitride and the first spacer layer may comprise silicon oxide. Anisotropic etching of the first spacer layer may form first spacers 111 along sidewalls of the gate patterns 105. In this embodiment, first spacer may be formed with a thickness of 1,000 Å. At this time, second spacer layer 107 remains.

Figure 13:
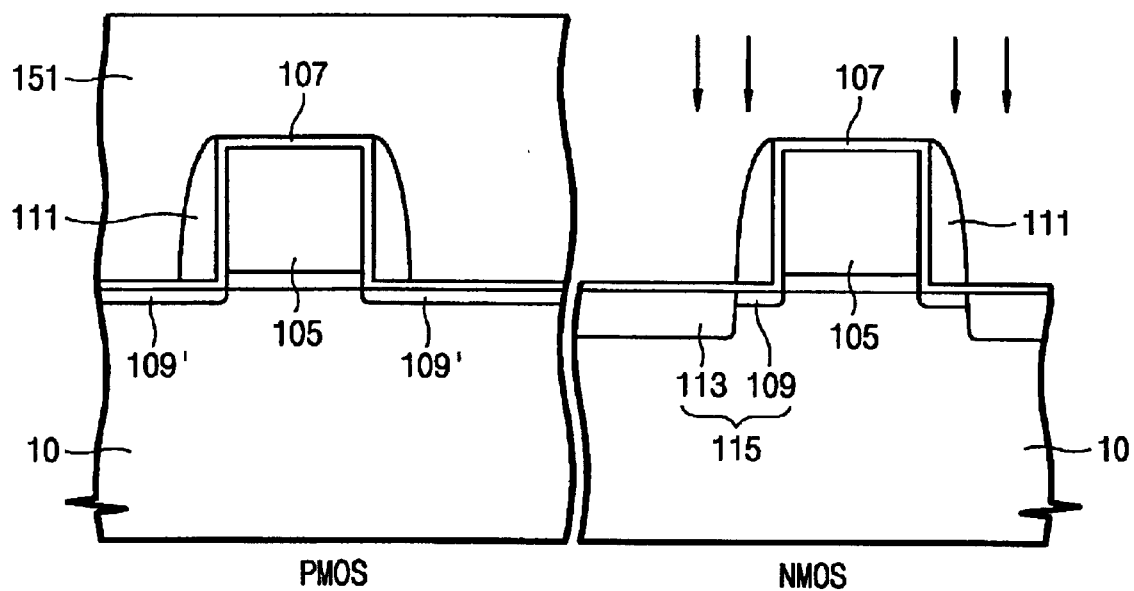

Referring to FIGS. 12 and 13, PMOS transistor region may be covered with photoresist pattern 151. A high-concentration of N-type impurity ions may then be implanted into select regions of the substrate as defined by masking of the photoresist pattern 151, first spacer 111 and gate pattern 105 of the NMOS transistor region.

Figure 14:
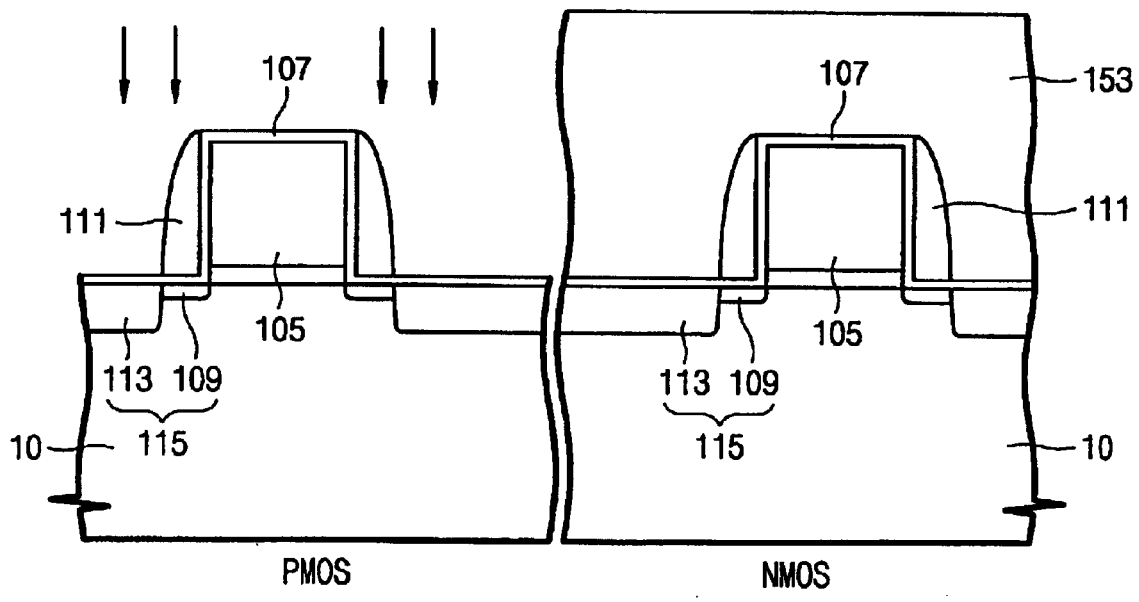

Referring to FIG. 14, the photoresist pattern 151 of FIG. 13 is removed and the NMOS transistor region is covered with a new photoresist pattern 153. A high-concentration of P-type impurity ions may then be implanted into select regions of the substrate as defined by masking of the photoresist pattern 153, first spacers 111 and the gate pattern 105 of the PMOS transistor region. Thus, a two-step masking and implant procedure may be used to form separate impurity type source/drain regions 115 of respective NMOS and PMOS transistor regions.

Figure 15:
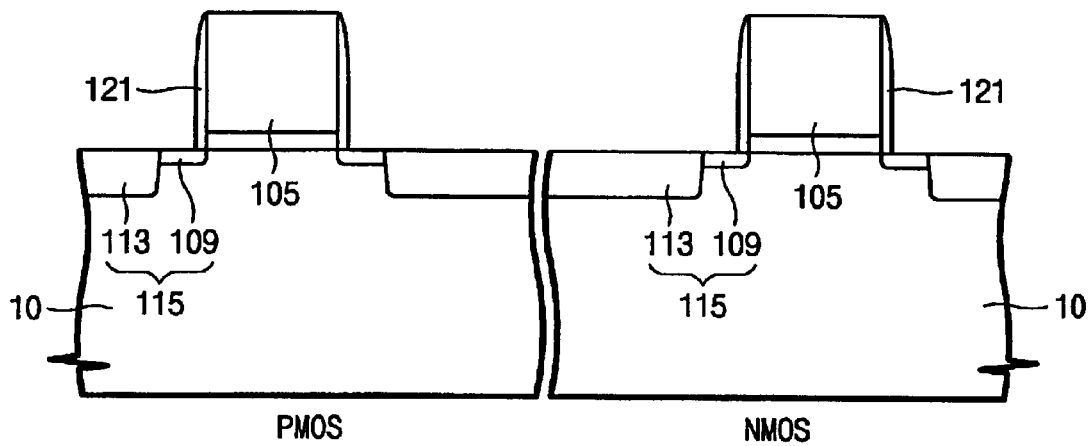

Referring to FIG. 15, the photoresist pattern 153 as illustrated in FIG. 14 is removed. The first spacers 111 may be removed using a silicon oxide layer etchant, e.g., of an isotropic etching. The second spacer layer 107 may then be anisotropically etched to leave thin second spacers 121 along sidewalls of the gate patterns 105.

Figure 16:
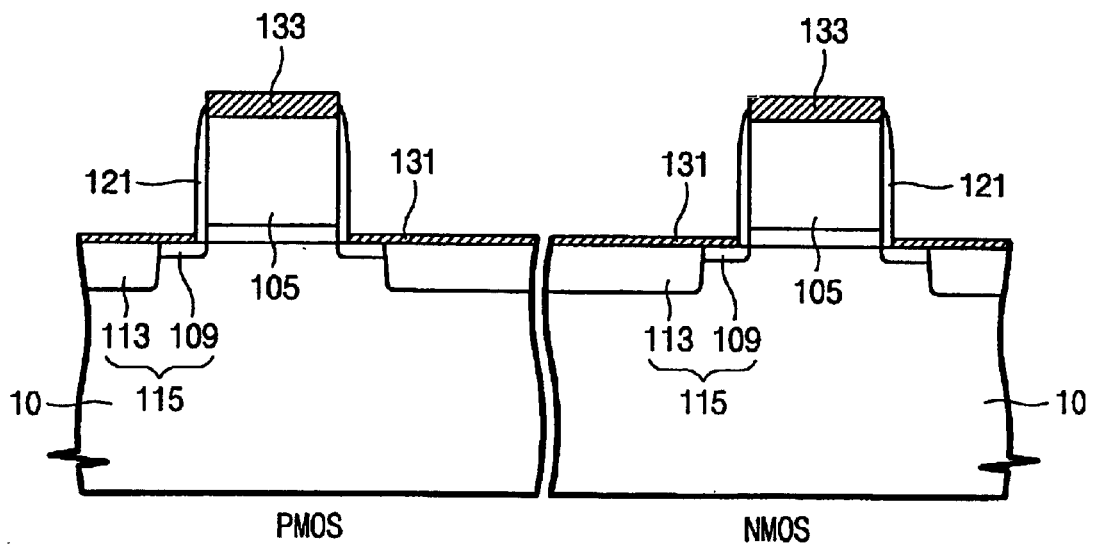

Referring to FIG. 16, a metal layer, e.g., such as cobalt, may be stacked over exposed regions of the substrate and over the polysilicon layer of the gate pattern 105 by employing a method of sputtering or CVD. Thermal treatment may then allow formation of metal silicide 131 and 133 at locations where the metal contacts the silicon, e.g., the substrate's silicon layer and polysilicon of the gate pattern 105. Metal at other locations will not be converted into silicide layer and may be removed by wet-etching.

Figure 17:
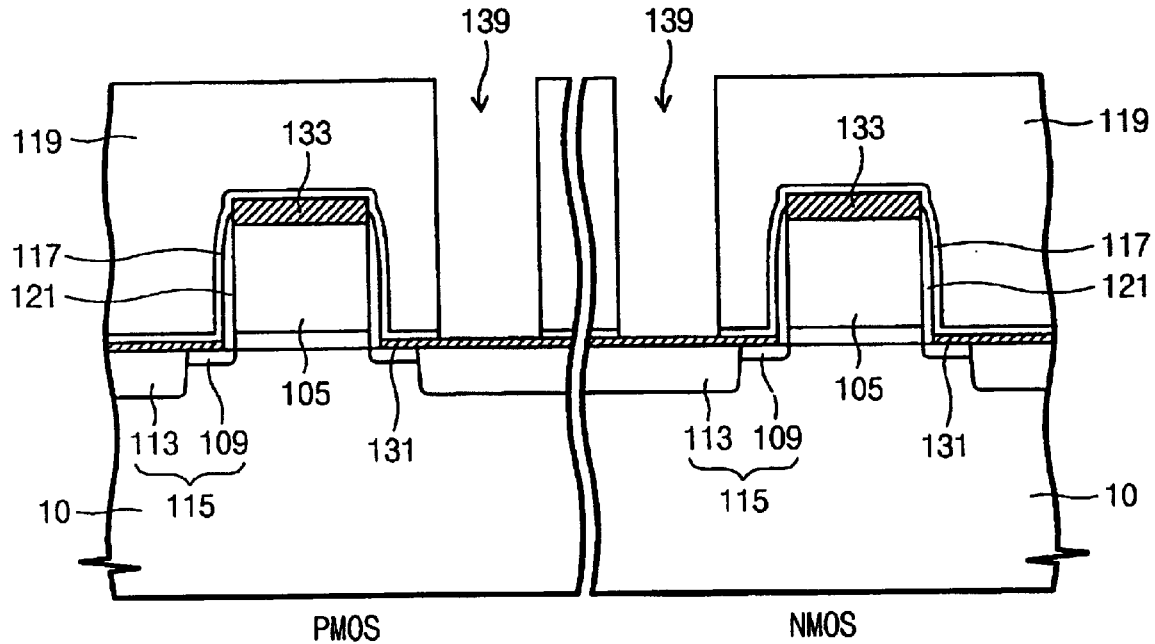

Referring to FIG. 17, an etch stop layer 117 may be formed as a thin layer, e.g., in one embodiment with a thickness of 50 to 300 Å, over the substrate 10 and including the metal silicide layers 131 and 133. The etch stop layer 117 may be formed with thickness less than the first spacer. An interlayer insulation layer 119 may be formed with a thickness suitable for covering the gate pattern 105. The layer may comprise a material suitable for stacking and planarization. Typically, the interlayer insulation layer 119 may then be planarized, e.g., by a CMP process. A contact hole 139 may then be formed to pierce the interlayer insulation layer 119 and the etch stop layer 117 over desired regions of the LDD-type source/drain regions 115. Similar contact openings may be formed through the interlayer insulation layer and etch stop layer to allow contact access to portions of the gate pattern 105. During etching of the interlayer insulation layer, etch stop layer 117 may protect the metal silicide layers 133 and 131 and the shallow impurity layer of the LDD-type source/drain regions 115 from being damaged by over-etching during patterning of the interlayer insulation layer 119. Also, the etch stop layer 117 may cooperate with the second spacer 121 to help guard against shorting between the contact and gate pattern 105, which might otherwise be a risk when small misalignments may occur during formation of the contact holes 139.

Accordingly, in this embodiment, a CMOS-type semiconductor device may be formed with metal silicide at the interface of the contact to decrease a resistance of an ohmic contact. Also, a spacer associated with defining doping profiles of the LDD-type regions may be removed to enhance the available space at both sides of the gate pattern.

Figure 18:
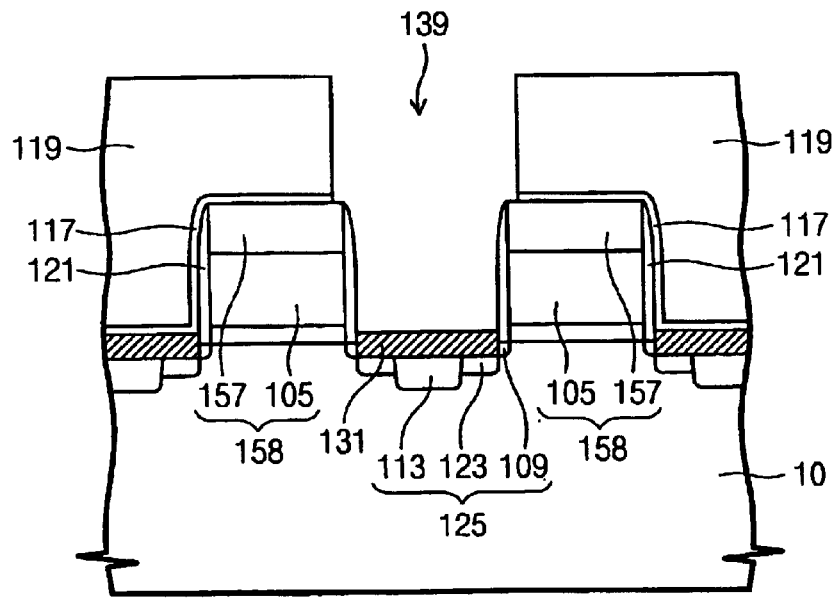
FIG. 18 is a partial cross-sectional view of a semiconductor device for illustrating other embodiments.

Referring to FIG. 18, in another embodiment, the LDD-type source/drain regions 125 between gate patterns 158 may be formed with a three-step impurity-ion implant procedure. A thin spacer 121, e.g., of silicon nitride, maybe formed along sidewalls of gate pattern 158. An etch stop layer 117, e.g., of silicon nitroxide, may be layered over gate pattern 158, spacer 121 and neighboring surfaces of substrate 10. The silicon nitroxide layer may decrease the potential stress at the interface between silicon nitroxide and the metal silicide 131 and may enhance the adhesion therebetween. The metal silicide layer 131 may be formed in the upper layer portions of the source/drain regions 113 and 123 that are located between the thin spacers 121 beside gate patterns 158. The top surface of the gate pattern 158 may be covered with a capping layer 157, which may comprise silicon nitride. A planarized interlayer insulation layer 119 may be formed over the etch stop layer 117 and to cover gate pattern 158. A contact hole 139 may pierce the interlayer insulation layer 119 and the etch stop layer 117 at locations between the gate patterns 158 to expose at least a portion of metal silicide 131. The metal silicide layer 131 may be formed with an extent to cover only portion 123 of source/drain regions of medium-concentration and portions 113 of high-concentration which are not covered by spacers 121. Of the three-step impurity regions associated with the LDD-type source/drain regions 125, the low-concentration regions 109 may remain substantially unaffected by the silicide formations.

Accordingly, the depth of forming the metal silicide layer 131 may be made similar to that of the ion-implantation layer of the low-concentration implant regions 109.

In the present embodiment, although the position of the contact plug formation may deviate by mis-alignment, the gate electrode may remain protected and isolated from the contact plug by capping layer 157 over the gate electrode 105 and by spacers 121 that cover the sidewalls of the gate pattern 105. With the thick spacer (i.e., that may have been used to define a boundary between the high and medium concentration regions 113, 123, respectively) removed, the contact plug may be coupled to the source/drain region with a wide contact area. Also, a metal silicide layer may be formed within the contact area to reduce the interface-contact resistance.

According to the present invention, certain spacers that may be used to form certain regions of LDD-type source/drain implants, including those that may have been used to define implants, such spacers may be removed. Thus, it is possible to reduce the risk of void formations during stacking of an interlayer insulation layer. Further, such spacer removals may allow formation of wide contact areas and, therefore, wide contact plugs and low contact-interface resistance. For embodiments that include a medium-concentration implant, thin spacers along sidewalls of the gate pattern may mask the source/drain region during the medium concentration implant and may also be used for defining the metal silicide regions. During the formation of the metal silicide layer, the thin spacers may cover and protect the shallow, low-concentration impurity implant regions and prevent these regions from being consumed by the silicide.

What is claimed is:

1. A method of fabricating a semiconductor to provide LDD-type source/drain regions, comprising:

forming at least one gate pattern in insulated relationship to a semiconductor substrate;

implanting low-concentration impurity ions to form source/drain regions within the semiconductor substrate on both sides of the gate pattern;

forming a second spacer layer conformal to the surface of the semiconductor substrate and the gate pattern, wherein the second spacer layer extends over the source/drain regions;

forming a first spacer on the second spacer layer and along the sidewalls of the gate pattern;

forming a high-concentration implant regions into the source/drain regions using at least the gate pattern and the first spacer as ion-implantation masks;

removing the first spacer;

after removing the first spacer, anisotropically etching the second spacer layer to expose portions of at least source/drain regions and to concurrently form second spacers on sidewalls of the gate pattern; and stacking and thermally treating a metal over the exposed portions of substrate as defined by the second spacers.

2. The method according to claim 1, wherein thermally treating a metal comprises forming a metal silicide where the metal contacts the source/drain regions.

3. The method of claim 2, further comprising:

stacking an etch stop layer over the substrate; and stacking an interlayer insulation over the etch stop layer, wherein the interlayer insulating layer has an etch selectivity with respect to the etch stop layer.

4. The method of claim 3, in which the etch stop layer is formed of a silicon oxynitride (SiON).

5. The method of claim 3, in which the second spacer layer is formed of a material having an etch selectivity with respect to the interlayer insulation layer and the first spacer.

6. The method of claim 2, further comprising, after forming the second spacer and before forming the metal silicide layer, implanting impurity ions of medium concentration between the source/drain regions and the high concentration implant regions.

* * * * *

UNITED STATES PATENT AND TRADEMARK OFFICE
CERTIFICATE OF CORRECTION

PATENT NO. : 6,737,308 B2
DATED : May 18, 2004
INVENTOR(S) : Kim

It is certified that error appears in the above-identified patent and that said Letters Patent is hereby corrected as shown below:

Column 1,
Line 53, "atoms/cm2 into" should read -- atoms/cm2, into --;

Column 4,
Line 19, "metal suicide formations" should read -- metal silicide formations --.

Column 6,
Line 22, "and suicide formations" should read -- and silicide formations --.

Column 8,
Line 31, "nitride, maybe formed" should read -- nitride, may be formed --.

Signed and Sealed this

Twenty-first day of December, 2004

JON W. DUDAS
*Director of the United States Patent and Trademark Office*